United States Patent
Cheng et al.

(10) Patent No.: US 9,224,607 B2
(45) Date of Patent: Dec. 29, 2015

(54) DUAL EPITAXY REGION INTEGRATION

(71) Applicant: GLOBALFOUNDRIES Inc., Grand Cayman (KY)

(72) Inventors: Kangguo Cheng, Schenectady, NY (US); Ali Khakifirooz, Mountain View, CA (US); Shom Ponoth, Clifton Park, NY (US); Raghavasimhan Sreenivasan, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/029,896

(22) Filed: Sep. 18, 2013

(65) Prior Publication Data

US 2015/0076608 A1  Mar. 19, 2015

(51) Int. Cl.

| | |
|---|---|
| *H01L 27/146* | (2006.01) |
| *H01L 21/28* | (2006.01) |
| *H01L 21/8238* | (2006.01) |
| *H01L 21/84* | (2006.01) |
| *H01L 27/092* | (2006.01) |
| *H01L 29/66* | (2006.01) |
| *H01L 21/02* | (2006.01) |

(52) U.S. Cl.
CPC ........ *H01L 21/28* (2013.01); *H01L 21/823814* (2013.01); *H01L 21/823821* (2013.01); *H01L 21/845* (2013.01); *H01L 27/0924* (2013.01); *H01L 29/66628* (2013.01); *H01L 21/0262* (2013.01); *H01L 21/02532* (2013.01); *H01L 21/02576* (2013.01); *H01L 21/02579* (2013.01)

(58) Field of Classification Search
CPC ...................... H01L 29/785; H01L 21/823468; H01L 21/28; H01L 29/66628; H01L 21/823821; H01L 21/845; H01L 27/0924; H01L 21/823814; H01L 21/02579; H01L 21/02576; H01L 21/02532; H01L 21/0632
USPC .......................................... 257/365; 438/240
See application file for complete search history.

(56) References Cited

U.S. PATENT DOCUMENTS

| | | | |
|---|---|---|---|
| 5,492,734 A | 2/1996 | Matsumoto et al. | |
| 6,511,876 B2 | 1/2003 | Buchanan et al. | |
| 6,521,502 B1* | 2/2003 | Yu ................................. | 438/305 |
| 6,528,858 B1* | 3/2003 | Yu ..................... | H01L 21/28167 |
| | | | 257/493 |
| 7,053,009 B2 | 5/2006 | Conley, Jr. et al. | |
| 7,223,677 B2 | 5/2007 | Frank et al. | |
| 7,914,847 B2 | 3/2011 | Verghese et al. | |
| 8,097,500 B2* | 1/2012 | Ando et al. ................... | 438/197 |
| 8,101,480 B1* | 1/2012 | Kim et al. ..................... | 438/231 |
| 8,390,073 B2* | 3/2013 | Hung et al. ................... | 257/369 |
| 8,420,476 B2* | 4/2013 | Booth, Jr. ........ | H01L 21/823821 |
| | | | 257/289 |
| 2006/0237788 A1* | 10/2006 | Ishimaru ....................... | 257/347 |
| 2007/0018245 A1* | 1/2007 | Jeng .................. | H01L 21/28282 |
| | | | 257/344 |
| 2012/0153399 A1* | 6/2012 | Hoentschel et al. .......... | 257/369 |
| 2012/0181617 A1* | 7/2012 | Luo et al. ...................... | 257/369 |
| 2013/0341722 A1* | 12/2013 | Illgen ..................... | H01L 21/84 |
| | | | 257/351 |
| 2014/0110793 A1* | 4/2014 | Hong .............. | H01L 21/823807 |
| | | | 257/369 |

* cited by examiner

*Primary Examiner* — William D Coleman
(74) *Attorney, Agent, or Firm* — David Cain; Andrew M. Calderon; Roberts Mlotkowski Safran & Cole, P.C.

(57) ABSTRACT

A semiconductor device includes a first device region and second device region of opposite polarity. Each device region includes at least a transistor device and associated epitaxy. A high-k barrier is formed to overlay the first device region epitaxy only. The high-k barrier may include a substantially horizontal portion formed upon a top surface of the first device region epitaxy and a substantially vertical portion formed upon an outer surface of the first device region epitaxy. The substantially vertical portion may partially isolate the first device region from the second device region.

17 Claims, 6 Drawing Sheets

DUAL EPITAXY REGION INTEGRATION

FIELD

Embodiments of invention generally relate to semiconductor devices, and more particularly to design structures, semiconductor devices, and fabrication of a semiconductor device with dual epitaxy regions.

DESCRIPTION OF THE RELATED ART

In semiconductor fabrication, in situ doping techniques are being utilized to increase semiconductor performance. Using these techniques, dopants are introduced into the semiconductor during its growth, most commonly during epitaxial growth of semiconductor layers. It is challenging therefore to attempt to integrate two epitaxial regions where each epitaxial region may be formed of different expitaxial material, undergo different in situ doping processes, etc. Typically in dual epitaxy region integrations, hardmasks may cover one device while epitaxy is formed on another device. In particular, to integrate two epitaxy layers with opposite doping polarity in the source and drain regions of NFET and PFET transistors a hardmask dielectric is typically deposited on both devices. The hardmask is then etched from a first device polarity (e.g. PFET, etc.) to form a spacer, while the hardmask is maintained on the second device polarity (e.g. NFET, etc.). A first in-situ doped epitaxy is then formed in the source/drain region of the first device polarity. Then a second hardmask dielectric is deposited on both devices. The second hardmask is kept on the first device polarity while the dielectric layer consisting of the first and second hardmasks is etched to form a spacer on the second device polarity. A second in-situ doped epitaxy is then deposited on the second device polarity. However, the above flow results in a thinner spacer layer on the first device polarity. Accordingly, there is a need for an improvement in design structures, semiconductor structures, and formation of semiconductor devices utilizing dual epitaxy regions.

SUMMARY

Embodiments of invention generally relate to semiconductor devices, and more particularly to design structures, semiconductor devices, and fabrication of a semiconductor devices with dual epitaxy regions.

In a first embodiment of the present invention, a semiconductor device includes a first device region and second device region of opposite polarity. Each device region includes at least a transistor device and associated epitaxy. The semiconductor device additional includes a high-k barrier that overlays the first device region epitaxy only. In another embodiment of the present invention, a design structure embodied in a machine readable storage medium for designing, manufacturing, or testing an integrated circuit includes the first device region, the second device region, the transistor devices and associated epitaxy, and the high-k barrier that overlays the first device region only.

In another embodiment of the present invention, a method of fabricating a semiconductor device includes forming a first device region and second device region of opposite polarity, wherein each device region includes a transistor device and associated epitaxy, and forming a high-k barrier over the first device region epitaxy only.

In yet another embodiment of the present invention, a method includes providing a semiconductor substrate including a first device region and second device region of opposite polarity, masking the first device region and the second device region, selectively removing the mask only in the first device region, forming an epitaxial layer upon the semiconductor substrate in the first device region, and forming a high-k barrier only over the first device region epitaxial layer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to the formation of, and structures utilizing FinFETs. A FinFET device may include a plurality of fins formed in a wafer and a gate covering a portion of the fins. The portion of the fins covered by the gate may serve as a channel region of the device. Portions of the fins may also extend out from under the gate and may serve as source and drain regions of the device. Typical integrated circuits may be divided into active areas and non-active areas.

The active areas may include FinFET devices. Each active area may have a different pattern density, or a different number of FinFET devices.

Referring now to FIGS., exemplary process steps of forming a structure 100 in accordance with embodiments of the present invention are shown, and will now be described in greater detail below. It should be noted that some of the FIGS. depict a cross section view of structure 100. Furthermore, it should be noted that while this description may refer to some components of the structure 100 in the singular tense, more than one component may be depicted throughout the figures and like components are labeled with like numerals. The specific number of components depicted in the figures and the cross section orientation was chosen for illustrative purposes only.

Figure 1:
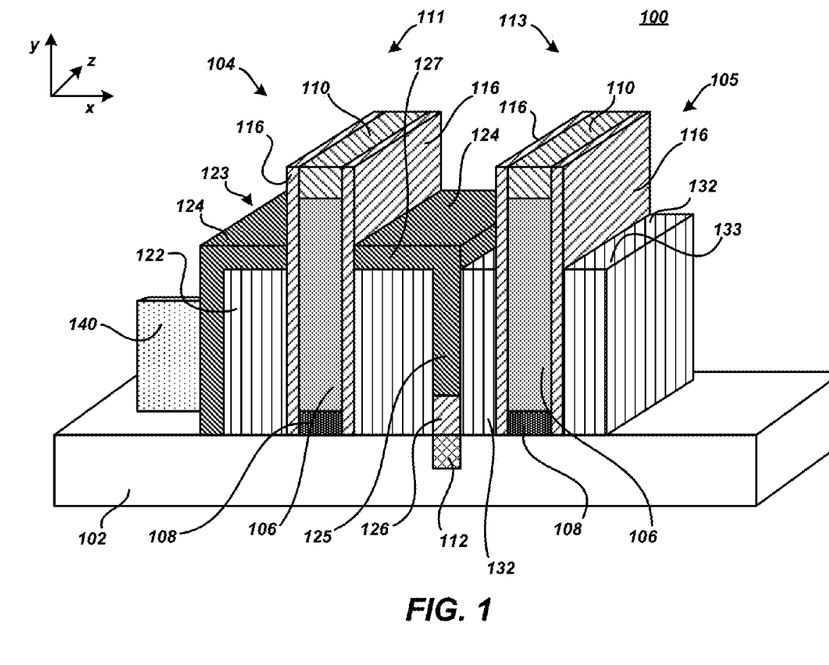
FIG. 1 depicts an isometric view of a semiconductor structure at an intermediate stage of semiconductor device fabrication, in accordance with various embodiments of the present invention.

FIG. 1 depicts an isometric view of an exemplary semiconductor structure 100 at an intermediate stage of semiconductor fabrication, in accordance with various embodiments of the present invention. At this fabrication stage semiconductor structure 100 includes a substrate 102 that supports at least a first device region 111 and second device region 113. Generally, first device region 111 is of opposite polarity to second device region 113. Each region includes a transistor device and associated epitaxy. For example, first device region 111 includes transistor device 104 and epitaxy 122 and second device region 113 includes transistor device 105 and epitaxy 132.

In certain embodiments, transistor device 104 may include a gate structure comprising a gate conductor 106, gate isolator 108, gate cap 110, and spacer 116, a channel region comprising of a polarity of fins wrapped by the gate (not visible in FIG. 1) and source and drain regions on each side of the gate structure that are covered by the epitaxy region 122. Transistor device 105 may include a gate structure comprising a gate conductor 106, gate isolator 108, gate cap 110, and spacers 116, a channel region that is wrapped between the gate structure and source and drain regions on each side of the gate structure that are covered between epitaxy region 132. Transistors 104 and 105 may also be other transistor devices such as a planar bulk or SOI device, gate-all-around nanowire, etc. In certain embodiments, transistor device 105 is a similar device to transistor device 104. In other embodiments, transistor device 105 differs from transistor device 104. In certain embodiments, spacers 106 in both transistor device 104 and 105 are generally formed of the same formation layer, and therefore, the thickness of spacers 106 are substantially equal.

Because the polarities of first device region 111 and second device region 113 are generally opposite, the makeup of epitaxy 122 typically differs from the makeup of epitaxy 132. As such, epitaxy 122 is electrically isolated from epitaxy 133 by a high-k barrier 124. In this manner, the opposite polarities of first device region 111 and second device region 113 may be maintained. Generally, a top surface 123 of epitaxy 122 is coplanar with a top surface 133 of epitaxy 132.

In certain embodiments the high-k barrier 124 is formed upon epitaxy 122 only. For example, high-k barrier 124 is formed upon epitaxy 122 prior to the formation of epitaxy 132. In certain embodiments high-k barrier 124 includes a substantially horizontal portion 127 formed upon upper surface 123 of epitaxy 122. Further, high-k barrier 124 may include a substantially vertical portion 125 that at least partially isolates epitaxy 122 from epitaxy 132. Additional isolative elements, such as, mask-remnant 126, and substrate isolator region 112 may also be utilized to adequately electrically isolate epitaxy 122 from epitaxy 132. In the embodiment where mask-remnant 126 is maintained, vertical portion 125 may be formed thereupon.

Figure 2:
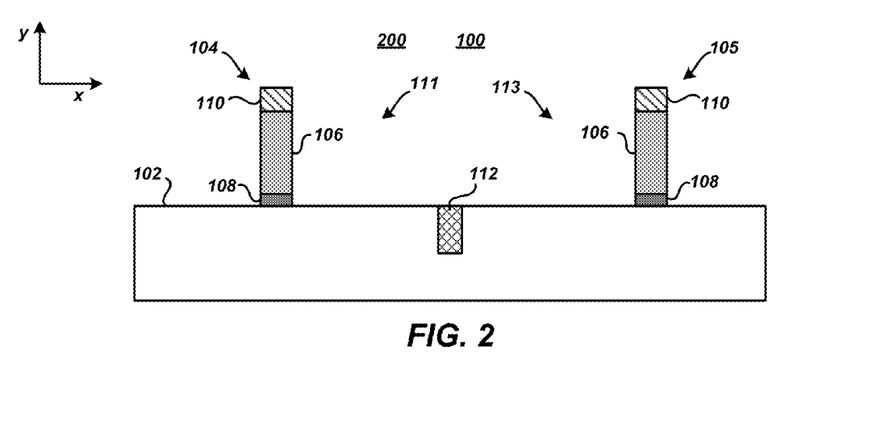
FIGS. 2-9 depict cross section views of a semiconductor structure at an intermediate stage of semiconductor device fabrication, in accordance with various embodiments of the present invention.

FIG. 2 depicts a cross section view of an exemplary semiconductor structure 100 at a transistor device formation stage 200 of semiconductor device fabrication, in accordance with various embodiments of the present invention. At this stage of fabrication, structure 100 may generally include the first device region 111, second device region 113, and substrate 102 including a substrate isolator region 112. Substrate 102 may include inner substrate devices (not shown) (e.g. source, drain, channel, etc.) in both the first device region 111 and second device region 113 that are electrically isolated by substrate isolator region 112.

Though transistor device formation stage 200 is depicted as an initial stage of semiconductor fabrication, it is to be understood that various prior fabrication stages may be completed prior to stage 200. For example, fins 140 may first be formed prior to transistor devices 104, 105, etc.

The semiconductor substrate 102 may be a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. A plurality of fins 140 may be etched from the substrate. When an SOI substrate is utilized, it may include a base substrate, a buried dielectric layer formed on top of the base substrate, and a SOI layer formed on top of the buried dielectric layer. The buried dielectric layer may isolate the SOI layer from the base substrate. A plurality of fins 140 may be etched from the SOI layer.

The base substrate may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate may be about, but is not limited to, several hundred microns thick. For example, the base substrate may have a thickness ranging from 0.5 mm to about 1.5 mm.

The buried dielectric layer may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 200 nm. In one embodiment, the buried dielectric layer may have a thickness ranging from about 150 nm to about 180 nm.

The SOI layer, for example the plurality of fins, may include any of the several semiconductor materials included in the base substrate. In general, the base substrate and the SOI layer may include either identical or different semiconducting materials with respect to chemical composition, dopant concentration and crystallographic orientation. The base substrate and the SOI layer include semiconducting materials that include at least different crystallographic orientations. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins may be etched from the SOI layer. Because the plurality of fins may be etched from the SOI layer, they too may include any of the characteristics listed above for the SOI layer.

Semiconductor structure 100 also includes transistor device 104 and transistor device 105. In certain embodiments, transistor device 104 may include a gate stack comprising a gate conductor 106, gate insulator 108, and gate cap 110 and a channel region formed in the substrate and under the gate insulator 108. In other embodiments, transistor device 104 may be other such transistor devices (e.g. FinFET, nanowire, etc.). Transistor device 105 may also include a gate stack comprising a gate conductor 106, gate insulator 108, and gate cap 110, and a channel region formed in the substrate and under the gate insulator 108. However, transistor 105 may also be other such transistor devices (e.g. FinFET, nanowire, etc.). In certain embodiments, transistor device 105 is a similar device to transistor device 104. In other embodiments, transistor device 105 differs from transistor device 104.

The gate stacks 104, 105 are generally formed upon the substrate 102 channel region. Depending upon the embodiment, the transistor device source/drain regions may be integral to substrate 102 or may be above substrate 102 (raised source/drain regions, etc.).

Gate insulator 108 insulates gate conductor 106 from the channel region and is generally a dielectric material (e.g. oxide, etc.) and may be a high-k material having a dielectric constant that is greater than the dielectric constant of silicon oxide, e.g., 3.9. Typically, high-k gate dielectric materials have a dielectric constant greater than 4.0, with a dielectric constant of greater than 8.0 being even more typical. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered high-k materials can also be employed as the gate insulator 108. Generally, gate insulator 108 is formed using widely known techniques. For example, gate insulator 108 can be formed utilizing a thermal oxidation and/or nitridation process or a deposition method (e.g. chemical vapor deposition (CVD), physical vapor deposition (PVD), molecular beam deposition (MBD), pulsed laser deposition (PLD), liquid source misted chemical deposition (LSMCD), atomic layer deposition (ALD), etc.).

Gate conductor 106 may be formed above the gate insulator 108. The gate conductor 106 may comprise any conductive material including, but not limited to, polycrystalline silicon, polycrystalline silicon germanium, an elemental metal (e.g., tungsten, titanium, tantalum, aluminum, nickel, ruthenium, palladium, platinum, etc.), an alloy of at least one elemental metal, an elemental metal nitride (e.g., tungsten nitride, aluminum nitride, and titanium nitride, etc.), an elemental metal silicide (e.g., tungsten silicide, nickel silicide, titanium silicide, etc.) and multilayers thereof. Depending upon the location of gate conductor 106 (e.g. first device region 111, second device region 113, etc.), gate conductor 106 can be comprised of a p-type gate metal or gate conductor 106 can be comprised of an n-type gate metal. Gate conductor 106 may be a single layer or multiple layer of conductive material.

Gate conductor 106 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate conductor 106 material, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process can be employed. The gate conductor 106 typically has a thickness from 5 nm to 200 nm, with a thickness from 20 nm to 100 nm being more typical. In some embodiments in which different polarity FETs are formed, the gate conductor 106 material in the different active device regions can be the same or different. Different gate conductor 106 materials can be formed, for example, using block mask technology.

Gate cap 110 is typically a silicon nitride, though other similar materials may be utilized and may serve as a contact to other semiconductor structure 100 device layers (e.g. Middle of Line, Back End of Line, etc.) (not shown). Though shown at initial stage 200, gate cap 110 may be formed during subsequent stages. For example, silicon nitride (SiN) may be deposited in recesses formed between spacers 116 over gate conductor 106.

Generally, gate conductor 106, gate insulator 108, and gate cap 110 may be formed by other known techniques without deviating from the spirit of those embodiments herein claimed.

Figure 3:
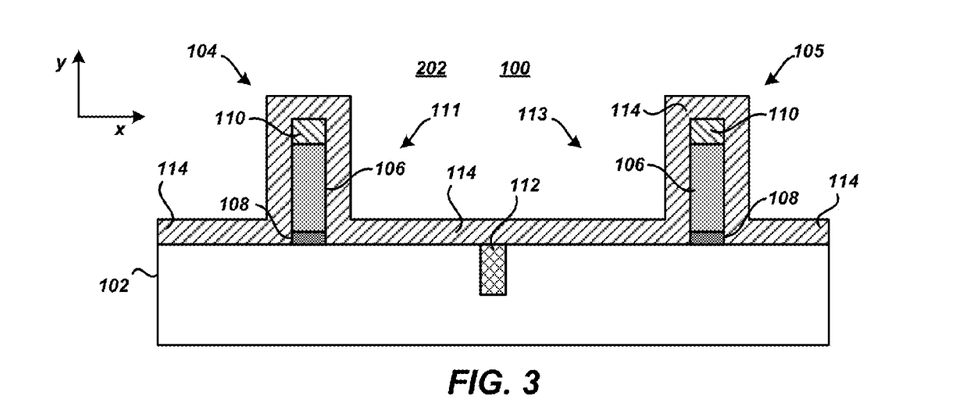

FIG. 3 depicts a cross section view of an exemplary semiconductor structure 100 at a hardmask formation stage 202 of semiconductor device fabrication, in accordance with various embodiments of the present invention. At this stage of fabrication, hardmask 114 may be deposited upon the structure 100 and be used to form one or more active areas and one or more non-active areas, for example the first device region 111, the second device region, and/or a non-active area (not shown), according to the embodiments described herein. At stage 202 hardmask 114 is generally a layer formed over at least the first device region 111 and second device region 113. Preferably, hardmask 114 is an oxide or nitride material and could be a bilayer of oxide and nitride (i.e., oxide deposited first and then nitride on top, or vice versa) and can be deposited over the semiconductor structure 100 using, e.g., a CVD process.

Figure 4:
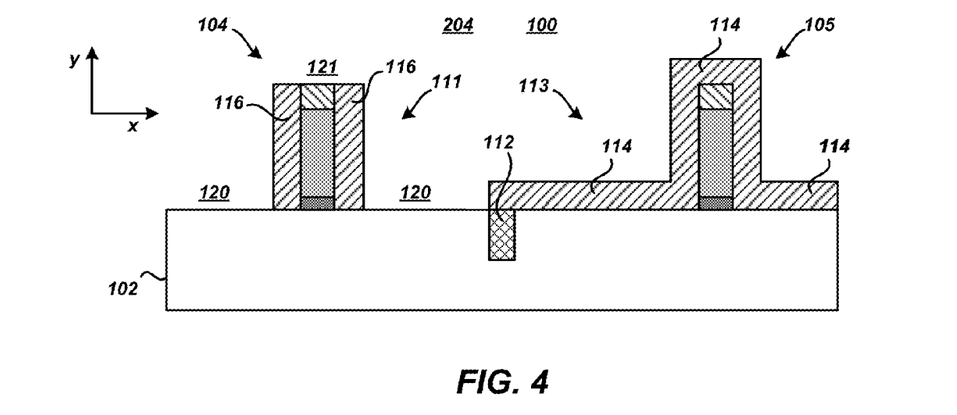

FIG. 4 depicts a cross section view of an exemplary semiconductor structure 100 at a selective hardmask removal stage 204 of semiconductor device fabrication, in accordance with various embodiments of the present invention. At this stage of fabrication, selective portions of hardmask 114 are removed, the remaining portions of hardmask 114 forming spacers 116 in the first device region 111 and covering second active region 113. The selective portions of hardmask 114 may be removed by generally known techniques. For example, a photoresist layer can be deposited over hardmask 114 using, e.g., spin coating. The photoresist may be patterned using conventional lithography techniques to form photoresist segments where one segment type generally does not mask the portions of mask 114 there below and a second segment type that does mask the portions of hardmask 114 there below. An anisotropic etch process such as reactive ion etching is used to etch the hardmask 114 in the regions not covered by the photoresist. The etch process is timed so that hardmask 114 is removed from horizontal surfaces that are not covered by the photoresist, while maintained on vertical sidewalls of the gate stack 121. When the semiconductor device 111 contain fins, the etch process is timed so that the hardmask 114 is removed from fin sidewalls while it is maintained at the vertical sidewalls of the gate stack 121.

Generally, mask 114 may be formed and selectively removed with other known or additional techniques than those described without deviating from the spirit of those embodiments herein claimed.

The remaining portions of hardmask 114 form spacers 116 in the first device region 111 and cover second active region 113. Because spacers are formed from hardmask 114, the thickness of spacers 116 are typically the same thickness as the original hardmask 114 layer. However, post processing may be used to change the thickness of spacers 116 relative to the thickness of hardmask 114. Removed areas 120 generally only expose the first device region 111 and therefore, for example, hardmask 114 may generally cover substrate isolator region 112 as well as second device region 113.

Figure 5:
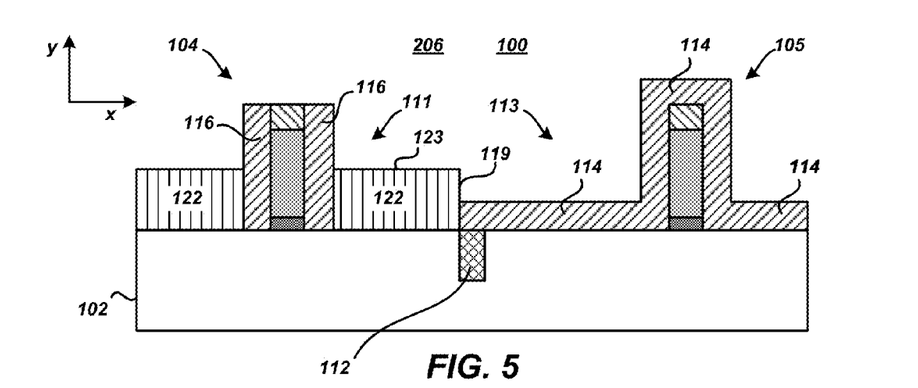

FIG. 5 depicts a cross section view of an exemplary semiconductor structure 100 at an epitaxy 122 formation stage 206 of semiconductor device fabrication, in accordance with various embodiments of the present invention. At this stage of fabrication, epitaxy 122 is formed in first device region 111. Depending upon the embodiment, raised source/drain regions may also be formed at stage 206. Epitaxy 122 may be formed on unmasked areas 120 in the first device region 111 upon substrate 102 using generally known techniques.

For example, epitaxy 122 may be formed by the growth of silicon performed in a silane environment that may contain an inert gas such as hydrogen, nitrogen or argon, using a low pressure chemical vapor deposition (LPCVD) process. Epitaxial silicon can be grown using various gas sources, e.g., silane ($SiH_4$), dichlorosilane (DCS), $SiF_4$, $SiCl_4$ or the like. If the first device region 111 is a PFET device, epitaxy 122 may preferably formed by the growth of SiGe by adding a germanium containing gas such as $GH_4$. Typical atomic percentage of Ge in the SiGe epitaxial layer 122 may be 20-50%, although lesser or greater values are possible. If the first device region 111 is an NFET device, epitaxy 122 may be Si:C grown by adding a carbon containing gas such as $CH_4$. Typical atomic percentage of C in the Si:C epitaxial layer may be 0.5-2%, although lesser or greater values are possible.

In one embodiment, epitaxy 122 may be doped with a dopant. For example, if the first device region 111 is a PFET, epitaxy 122 may be doped by B with a typical concentration of above $10^{20}$ $cm^{-3}$ by adding a B containing gas such as $BH_3$. If the first device region 111 is an NFET, epitaxy 122 may be doped by As or P at a typical concentration of above $10^{20}$ $cm^{-3}$ by adding an Ar or P containing gas such as $AsH_3$ or $PH_3$.

Generally, epitaxy 122 may be formed on unmasked areas 120 in the first device region 111 upon substrate 102 with other known or additional techniques than those described without deviating from the spirit of those embodiments herein claimed.

Preferably, epitaxy 122 has a hydrogen-terminated top surface 123 and outer surface 119. This may be done, for example, by generally etching top surface 123 and outer surface 119 in hydrogen fluoride aqueous solution, leaving the surface atoms covalently bonded to hydrogen.

Figure 6:
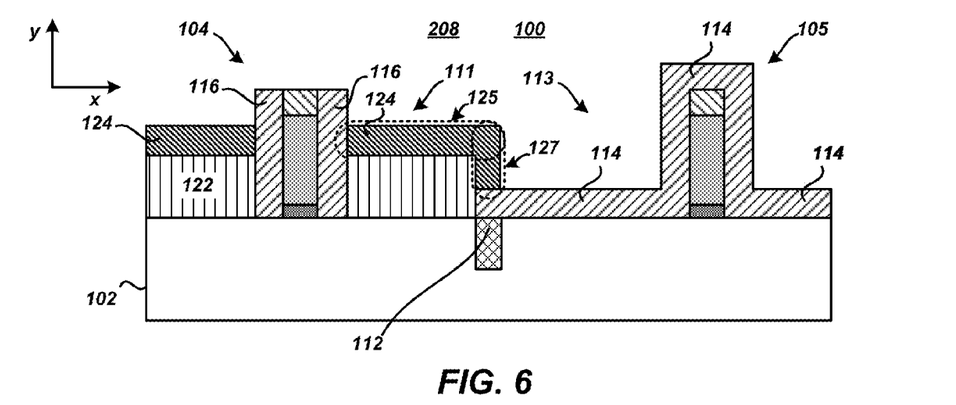

FIG. 6 depicts a cross section view of an exemplary semiconductor structure 100 at a high-k barrier 124 formation stage 208 of semiconductor device fabrication, in accordance with various embodiments of the present invention. At this stage of fabrication, high-k barrier 124 is selectively formed upon epitaxy 122. Preferably, high-k barrier 124 is a material that grows only upon epitaxy 122. For example, high-k barrier 124 is grown only on a hydrogen terminated Si, SiGe, or Si:C epitaxy 122 but not grown on an oxide mask 114 or nitride mask 114. As such, high-k barrier 124 may grow upwardly from top surface 123 and outwardly from outer surface 119 of epitaxy 122.

In certain embodiments high-k barrier 124 includes a substantially horizontal portion 127 formed upon upper surface 123 of epitaxy 122. Substantially horizontal portion 127 is generally of greater width than height. Further, high-k barrier 124 may include a substantially vertical portion 125 formed upon outer surface 119 of epitaxy 122. Substantially vertical portion 125 is generally of greater height than width. Though, substantially vertical portion 125 is typically grown from outer surface 119 of epitaxy 122, it may contact the upper surface of hardmask 114.

High-k barrier 124 is generally a high-k material having a dielectric constant that is greater than the dielectric constant of silicon oxide, e.g., 3.9. Typically, high-k materials have a dielectric constant greater than 4.0, with a dielectric constant of greater than 8.0 being even more typical. Exemplary high-k dielectric materials include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, a silicate thereof, and an alloy thereof. Multilayered high-k materials can also be employed as the high-k barrier 124. Generally, high-k barrier 124 is formed using a chemical vapor deposition (CVD) or atomic layer deposition (ALD). For example, R. Chen, et al., "Achieving area-selective atomic layer deposition on patterned substrates by selective surface modification" Applied Physics Letters, vol. 86, no. 19, p. 191910, 2005, teach an ALD method to deposit $HfO_2$ only on hydrogen-terminated Si surface and not on silicon dioxide surface.

Figure 7:
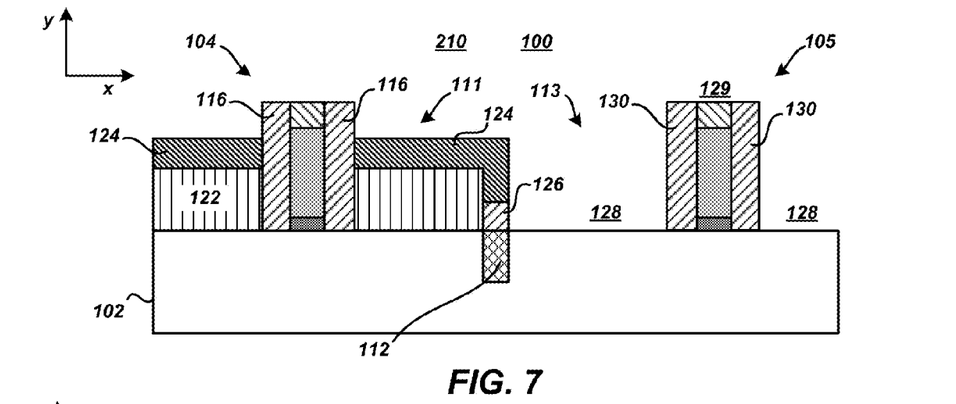

FIG. 7 depicts a cross section view of an exemplary semiconductor structure 100 at a hardmask removal stage 210 of semiconductor device fabrication, in accordance with various embodiments of the present invention. At this stage of fabrication, hardmask 114 is selectively removed from second device region 113. The selective portions of hardmask 114 may be removed by generally known techniques and may be removed with a similar or different technique as described in stage 204. The selective removal of hardmask 114 results in unmasked areas 128 and spacer 130 formation in the second device region 113. A mask-remnant 126 of hardmask 114 material that is under vertical high-k portion 125 may also remain subsequent to hardmask 114 removal.

The hardmask 114 may be removed from the second device region for example using a RIE process that is timed to remove portions of the hardmask 114 that is deposited on horizontal surface and form spacers 130. If the second semiconductor device 105 is a FinFET, the RIE process can be timed so that it removes the hardmask 114 from the vertical surface of the fins while forming spacer 130 on the vertical sidewalls of the gate stack 129. During the removal of the hardmask 114 from the second device region 113, the first device region 111 may be optionally protected by a photoresist. If the first device region 111 is not covered by photorests, spacers 116 and gate hardmask of the transistor 104 are recessed during the RIE process used to remove the hardmask 114 from the second device region 113. Generally, mask 114 may be selectively removed within second device region 113 with other known or additional techniques than those described without deviating from the spirit of those embodiments herein claimed.

Because spacers 130 are formed from mask 114, the thickness of spacers 130 are typically the same thickness as the original mask 114 layer and spacer 116 thickness. However, post processing may be used to change the thickness of spacers 130 relative to the thickness of mask 114 and/or spacers 116.

Figure 8:
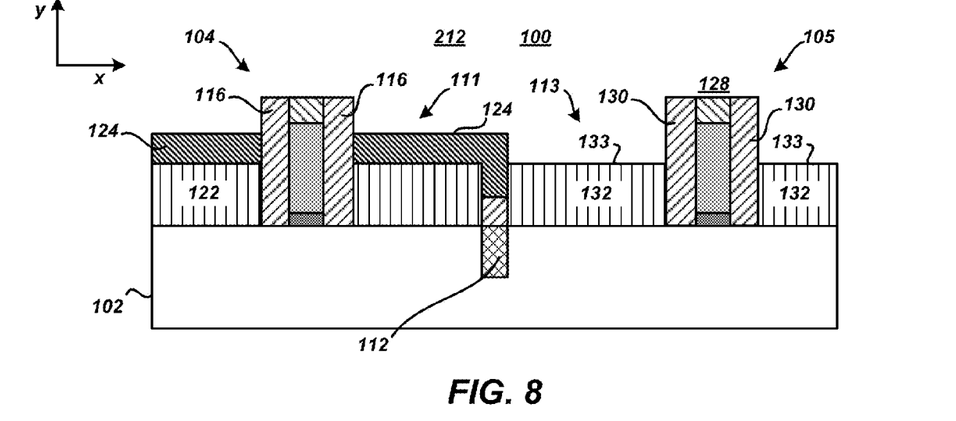

FIG. 8 depicts a cross section view of an exemplary semiconductor structure 100 at an epitaxy formation stage 212 of semiconductor device fabrication, in accordance with various embodiments of the present invention. At this stage of fabrication, epitaxy 132 is selectively formed in second device region 113. Depending upon the embodiment, raised source/drain regions may also be formed at stage 212. Epitaxy 132 may be formed on unmasked areas 128 in the second device region 113 upon substrate 102 using generally known techniques. Epitaxy 132 may be a similar composition relative to epitaxy 123. However, epitaxy 132 is typically of a different composition relative to epitaxy 123. For example, epitaxy 132 need not have a hydrogen-terminated top surface, epitaxy 132 may be doped with opposite polarity dopants relative to epitaxy 123, etc. In certain embodiments, the top surface 133 of epitaxy 132 is formed to be coplanar with the top surface 123 of epitaxy 122.

In certain embodiments, substantially vertical portion 125 and mask-remnant 126 isolate epitaxy 122 from epitaxy 132. Similarly, substantially vertical portion 125, mask-remnant 126, and substrate isolator region 112 isolate first device region 111 from second device region 113.

Figure 9:
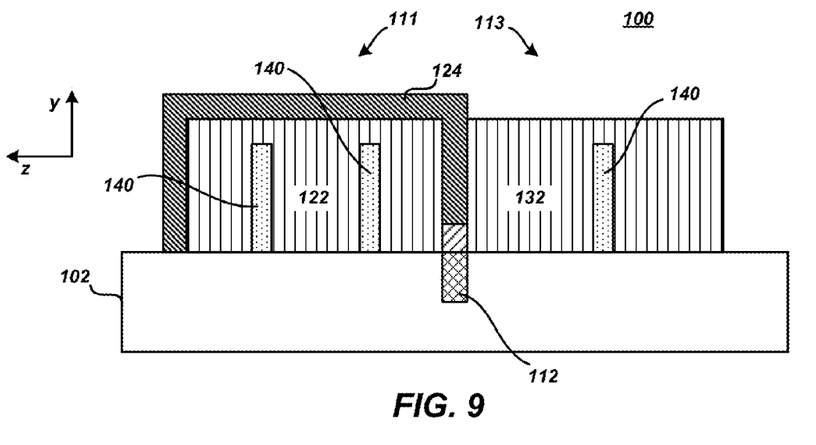

FIG. 9 depicts a cross section view of an exemplary semiconductor structure 100 at an intermediate stage of semiconductor fabrication, in accordance with various embodiments of the present invention. In FIG. 9, semiconductor device 100 depicts FinFET fins 140 as the transistor devices within the first device region 111 and second device region 113. For example, first device region 111 includes multiple fins 140 and associated epitaxy 122 and second device region 113 includes fins 140 and associated epitaxy 132.

Semiconductor structure 100 may undergo further fabrication stages (e.g. fill deposit and polish, Middle of Line contact formation, Middle of Line fill formation, etc.) to produce a semiconductor device.

Figure 10:
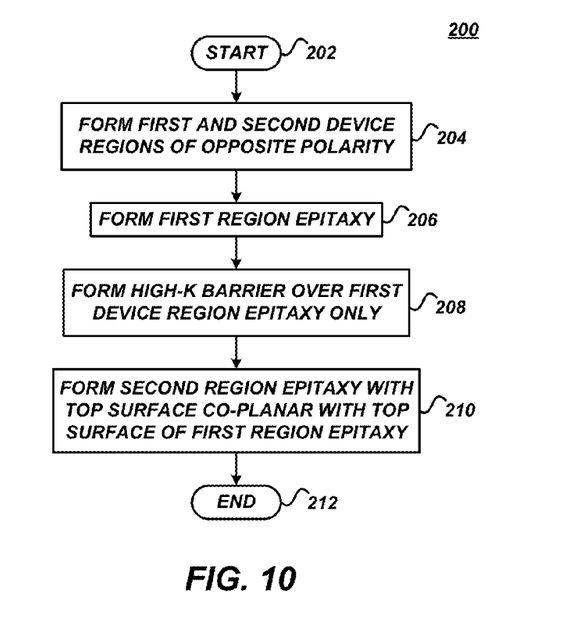
FIG. 10 depicts a process of fabricating a semiconductor device, in accordance with various embodiments of the present invention.

Referring now to FIG. 10, a process 200 of fabricating a semiconductor device is shown. Process 200 starts at block 202 and continues with forming a first device region 111 and a second device region 113 of generally opposite polarities (block 204). Process 200 continues with forming an epitaxy 122 within the first device region 111 (block 206). Process 200 continues with forming a high-k barrier 124 over epitaxy 122 within the first device region 111 (block 208). Process 200 continues with forming an epitaxy 132 within the second device region 113 (block 210). Process 200 ends at block 212.

Figure 11:
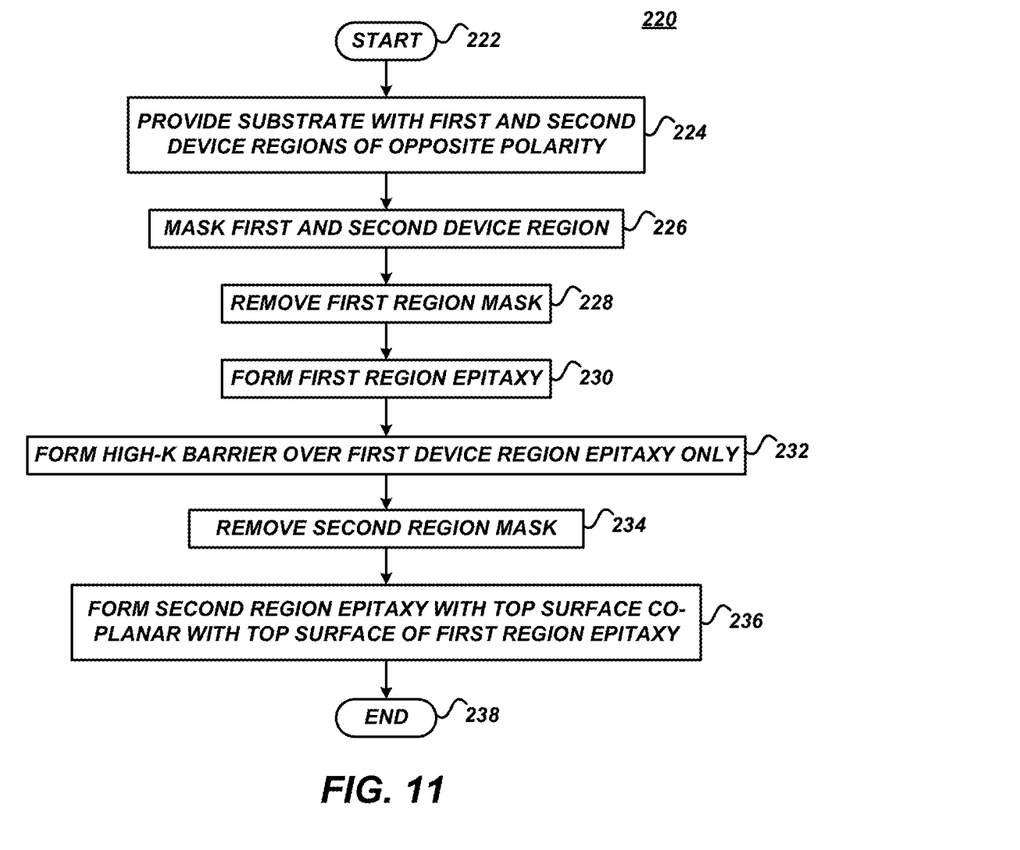
FIG. 11 depicts an exemplary process flow, in accordance with various embodiments of the present invention.

Referring now to FIG. 11, a process 220 is shown. Process 220 starts at block 222 and continues with providing a semiconductor substrate 102 with a first device region 111 and a second device region 113 of generally opposite polarities (block 224). Process 220 continues by forming a mask 114 upon the first device region 111 and second device region 113 (block 226). Process 220 continues by selectively removing mask 114 in the first device region 111 (block 228). Process 220 continues by forming epitaxy 122 within the first device region 111 (block 230). In certain embodiments forming epitaxy 122 within the first device region 111 further includes forming a hydrogen-terminated top surface 123 and hydrogen-terminated outer surface 119 of epitaxy 122. Process 220 continues by forming a high-k barrier upon epitaxy 122 (block 232). Process 220 continues by selectively removing mask 114 in the second device region 113 (block 234). Process 220 continues by forming epitaxy 132 in the second device region (block 236). Process 200 ends at block 238.

The fabrication of the semiconductor structure(s) herein has been described by a specific order of fabrication stages and steps. However, it is understood that the order may differ from that described. For example, the order of two or more fabrication steps may be switched relative to the order shown. Moreover, two or more fabrication stages or specific techniques may be conducted either concurrently or with partial concurrence. In addition, various fabrication steps may be omitted and other fabrication steps may be added. It is understood that all such variations are within the scope of the present invention.

Figure 12:
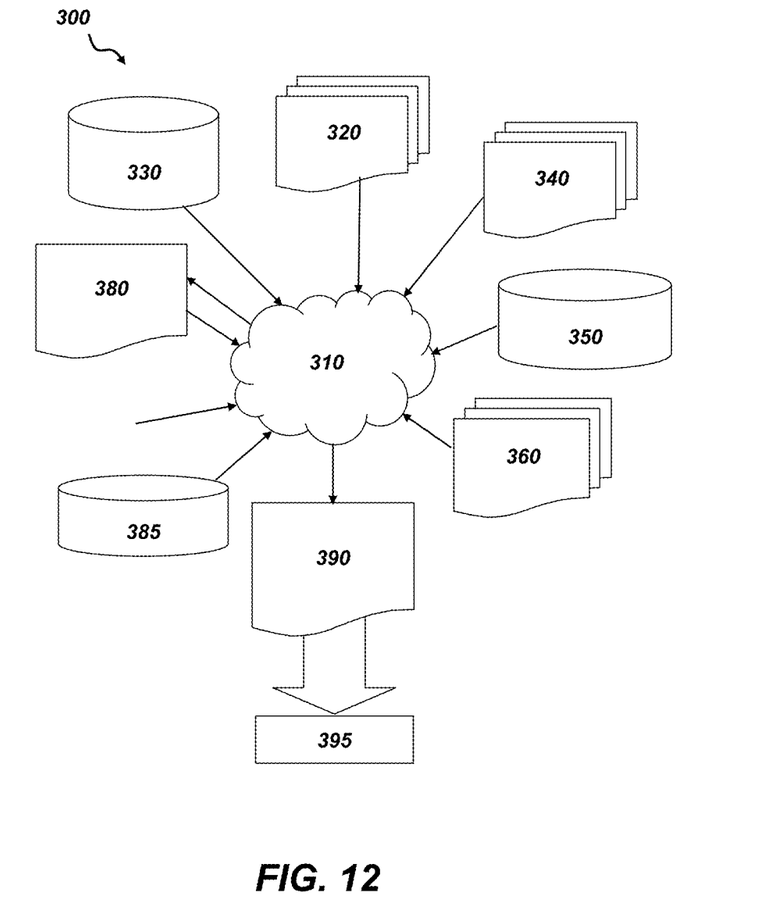
FIG. 12 depicts a flow diagram of a design process used in semiconductor design, manufacture, and/or test, in accordance with various embodiments of the present invention.

Referring now to FIG. 12, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-9.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-9. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-9 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 390 may comprise a compiled, executable HDL simulation model that functionally simulates the devices shown in FIGS. 1-9.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device comprising:
   a first device region and second device region of opposite polarity, each device region comprising:
      a transistor device and associated epitaxy;
   a high-k barrier overlying the first device region epitaxy only, the high-k barrier comprising:
      a substantially horizontal portion formed upon the first device region epitaxy, and;
      a substantially vertical portion that at least partially isolates the first device region from the second device region.

2. The semiconductor device of claim 1 wherein each transistor device comprises:
   a spacer that isolates a transistor gate stack from the associated epitaxy.

3. The semiconductor device of claim 1 wherein the thickness of the first device region spacer is substantially equal to the thickness of the second device region spacer.

4. The semiconductor device of claim 1 wherein a top surface of the first device region epitaxy is coplanar with a top surface of the second device region epitaxy.

5. The semiconductor device of claim 1 wherein the substantially vertical portion is formed upon a masking-remnant associated with masking the second device region from the formation of the first device region epitaxy.

6. A method of fabricating a semiconductor device comprising:
   forming a first device region and second device region of opposite polarity, each device region comprising a transistor device and associated epitaxy, and;
   forming a high-k barrier over the first device region epitaxy only by forming a horizontal high-k portion upon the first device region epitaxy and forming a substantially vertical high-k portion that at least partially isolates the first device region from the second device region.

7. The method of claim 6 wherein each transistor device comprises a spacer that isolates a transistor gate stack from the associated epitaxy.

8. The method of claim 6 wherein the thickness of the first device region spacer is substantially equal to the thickness of the second device region spacer.

9. The method of claim 6 wherein a top surface of the first device region epitaxy is coplanar with a top surface of the second device region epitaxy.

10. The method of claim 6 wherein forming the substantially vertical high-k portion further comprises:
    forming the vertical high-k portion upon a masking-remnant associated with masking the second device region from the formation of the first device region epitaxy.

11. A method comprising:
    providing a semiconductor substrate comprising a first device region and second device region of opposite polarity;
    masking the first device region and the second device region;
    selectively removing the mask only in the first device region;
    forming an epitaxial layer upon the semiconductor substrate in the first device region, and;
    forming a high-k barrier only over the first device region epitaxial layer by forming a horizontal high-k portion upon the first device region epitaxy and forming a substantially vertical high-k portion that at least partially isolates the first device region from the second device region.

12. The method of claim 11 further comprising:
    selectively removing the mask in the second device region.

13. The method of claim 11 further comprising:
    forming an epitaxial layer upon the semiconductor substrate in the second device region.

14. The method of claim 11 wherein selectively removing the mask only in the first device region forms first device region transistor device spacers.

15. The method of claim 11 wherein forming the substantially vertical high-k portion further comprises:
    forming the vertical high-k portion upon a masking-remnant associated with masking the first device region and the second device region.

16. The method of claim 13 wherein a top surface of the first device region epitaxy is coplanar with a top surface of the second device region epitaxy.

17. The method of claim 12 wherein selectively removing the mask only in the second device region forms second device region transistor device spacers.

\* \* \* \* \*